US008962350B2

(12) United States Patent
Srinivasan et al.

(10) Patent No.: US 8,962,350 B2
(45) Date of Patent: Feb. 24, 2015

(54) MULTI-STEP DEPOSITION OF FERROELECTRIC DIELECTRIC MATERIAL

(71) Applicant: Texas Instruments Incorporated, Dallas, TX (US)

(72) Inventors: Bhaskar Srinivasan, Plano, TX (US); Brian E. Goodlin, Plano, TX (US); Haowen Bu, Plano, TX (US); Mark Visokay, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/169,120

(22) Filed: Jan. 30, 2014

(65) Prior Publication Data
US 2014/0225226 A1    Aug. 14, 2014

Related U.S. Application Data

(60) Provisional application No. 61/763,001, filed on Feb. 11, 2013.

(51) Int. Cl.
*H01L 21/00* (2006.01)
*H01L 21/02* (2006.01)
*C23C 18/12* (2006.01)
*H01L 49/02* (2006.01)

(52) U.S. Cl.
CPC ...... *H01L 21/02112* (2013.01); *C23C 18/1216* (2013.01); *H01L 21/02197* (2013.01); *H01L 28/56* (2013.01); *H01L 21/022* (2013.01); *H01L 21/02263* (2013.01)
USPC ............... 438/3; 438/681; 438/680; 257/295

(58) Field of Classification Search
CPC ............ H01L 21/02112; H01L 21/02197; H01L 21/02263; H01L 28/56
USPC ................ 438/3, 680, 681; 257/295
See application file for complete search history.

(56) References Cited

U.S. PATENT DOCUMENTS

| | | | |
|---|---|---|---|
| 6,104,049 A | | 8/2000 | Solayappan et al. |
| 6,316,797 B1 | | 11/2001 | Van Buskirk et al. |
| 6,656,748 B2 | | 12/2003 | Hall et al. |
| 6,730,354 B2 | | 5/2004 | Gilbert et al. |
| 6,984,417 B2 | | 1/2006 | Van Buskirk et al. |
| 7,312,091 B2 | | 12/2007 | Lee et al. |
| 7,862,857 B2 | | 1/2011 | Van Buskirk et al. |
| 2002/0074601 A1 | | 6/2002 | Fox et al. |
| 2007/0122947 A1* | | 5/2007 | Sakurai et al. ............... 438/148 |
| 2009/0035877 A1* | | 2/2009 | Im et al. ............................ 438/3 |
| 2010/0078762 A1* | | 4/2010 | Wang ............................ 257/532 |
| 2013/0056811 A1 | | 3/2013 | Lin et al. |

\* cited by examiner

*Primary Examiner* — Nicholas Tobergte
(74) *Attorney, Agent, or Firm* — Rose Alyssa Keagy; Frederick J. Telecky, Jr.

(57) ABSTRACT

Multi-step deposition of lead-zirconium-titanate (PZT) ferroelectric material. An initial portion of the PZT material is deposited by metalorganic chemical vapor deposition (MOCVD) at a low deposition rate, for example at a temperature below about 640 deg C. from vaporized liquid precursors of lead, zirconium, and titanium, and a solvent at a collective flow rate below about 1.1 ml/min, in combination with an oxidizing gas. Following deposition of the PZT material at the low flow rate, the remainder of the PZT film is deposited at a high deposition rate, attained by changing one or more of precursor and solvent flow rate, oxygen concentration in the oxidizing gas, A/B ratio of the precursors, temperature, and the like.

16 Claims, 6 Drawing Sheets

MULTI-STEP DEPOSITION OF FERROELECTRIC DIELECTRIC MATERIAL

CROSS-REFERENCE TO RELATED APPLICATIONS

This application claims priority, under 35 U.S.C. §119(e), of Provisional Application No. 61/763,001, filed Feb. 11, 2013, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to the formation of capacitor plates in memory devices such as ferroelectric memories.

Conventional metal-oxide-semiconductor (MOS) and complementary MOS (CMOS) logic and memory devices are prevalent in modern electronic devices and systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead-zirconium-titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits.

Non-volatile solid-state read/write random access memory (RAM) devices based on ferroelectric capacitors, such memory devices commonly referred to as "ferroelectric RAM", or "FeRAM", or "FRAM" devices, have been implemented in many electronic systems, particularly portable electronic devices and systems. FRAMs are especially attractive in implantable medical devices, such as pacemakers and defibrillators. Various memory cell architectures including ferroelectric capacitors are known in the art, including the well-known 2T2C (two transistor, two capacitor) cells. Another type of FRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors.

As mentioned above, polarizability of the ferroelectric material provides the mechanism for non-volatile storage of a binary state in a ferroelectric capacitor. FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "−1" state, and will exhibit a stored charge of $-Q_2$ for applied voltage V below $+V_\alpha$.

An important characteristic of ferroelectric capacitors, for purposes of non-volatile storage in integrated circuits, is the difference in capacitance that a ferroelectric capacitor exhibits between its polarized states. In the operation of a typical FRAM, the logic state stored by a memory cell is read by interrogating the capacitance, and thus the polarized state, of its ferroelectric capacitor. Referring to the example of FIG. 1, the polarization of a ferroelectric capacitor from its "−1" state to its "+1" state is reflected in a relatively high capacitance C(−1), by way of which polarization charge involved in the change of polarization state is retained within the capacitor as the voltage exceeds its coercive voltage $V_\alpha$; on the other hand, a capacitor already in its "+1" state exhibits little capacitance C(+1) due to polarization, since its ferroelectric domains are already aligned prior to the application of the voltage. The polarization ability of a ferroelectric capacitor is reflected in the difference in polarization charge between its "−1" and "+1" polarization states (i.e., $(+Q_1-(-Q_2))$), which is commonly referred to as the switching polarization parameter Psw. A relatively large value of switching polarization Psw means will be reflected in a large value of capacitance C(−1) relative to the value of capacitance C(+1). On the other hand, if switching polarization Psw is relatively low (and assuming that coercive voltages $+V_\alpha$ and $-V_\beta$ remain constant), the capacitance line C(−1) will have a flatter slope, reflecting a lower capacitance. The difference in capacitances between the two polarization states of the capacitor thus reduces as switching polarization parameter Psw decreases, which appears as a poorer read margin for the corresponding FRAM cell. Conversely, a higher value for switching polarization parameter Psw corresponds to an improved read margin for the FRAM cell.

It has been observed that the parameter of switching polarization Psw depends strongly on the manner in which the ferroelectric capacitor dielectric material is formed, particularly for the case of lead-zirconium-titanate (PZT). As described in U.S. Pat. No. 6,730,354, incorporated herein by reference, the formation of a PZT film in the manufacture of a semiconductor integrated circuit is commonly carried out by way of metalorganic chemical vapor deposition (MOCVD). It has been observed that this MOCVD technique is capable of depositing a very thin PZT film of sufficient quality to serve as a capacitor dielectric. More specifically, it has been observed that the MOCVD conditions of low precursor flow (the collective flow rate of the lead, zirconium, and titanium precursors, and the appropriate solvent of less than about 1.1 ml/min) and a process temperature below about 640 deg C. can provide a thin PZT film that, as the dielectric of a ferroelectric capacitor, can exhibit a relatively high switching polarization Psw.

However, it has also been observed that the low flow rate, low temperature, MOCVD deposition of PZT necessarily results in a very low deposition rate and a corresponding high consumption of the precursors. The resulting low manufacturing throughput and high material costs increase the manufacturing cost of the FRAM devices. The deposition rate of MOCVD PZT at this low temperature cannot be increased by increasing the precursor flow rate, because of the inability to closely control the relative nucleation of lead, zirconium, and titanium at such higher flow rates under low temperature. In particular, it has been observed that the relative nucleation of lead and lead oxide tends to increase under low temperature, absent close control of the individual precursor flows. The increased nucleation of lead forms an undesired second phase with a rough spatial morphology, appearing as a "haze" in the deposited film when viewed using light-scattering techniques. This roughness of the "haze" defects is also reflected in degraded electrical performance of the ferroelectric elements, typically as increased leakage, and thus reduced electrical yield and poorer device performance.

BRIEF SUMMARY OF THE INVENTION

Disclosed embodiments provide a method of depositing lead-zirconium-titanate (PZT) ferroelectric material in the manufacture of an integrated circuit structure, and a structure so manufactured, in which high-polarization ferroelectric material is deposited at a relative high rate.

Disclosed embodiments provide such a method and structure in which the formation of "haze" defects is avoided.

Disclosed embodiments provide such a method and structure that provides very thin, high quality, ferroelectric films suitable for use in modern deep submicron integrated circuits.

Other objects and advantages of the disclosed embodiments will be apparent to those of ordinary skill in the art having reference to the following specification together with its drawings.

According to certain embodiments, the deposition of lead-zirconium-titanate (PZT) ferroelectric material may be implemented by way of a plurality of metalorganic chemical vapor deposition (MOCVD) steps performed in sequence. A first deposition step forms a first layer of PZT over an electrode layer under low deposition rate conditions, followed by the deposition of a second layer of PZT under higher deposition rate conditions.

DETAILED DESCRIPTION OF THE INVENTION

The one or more embodiments disclosed in this specification are described as implemented into the manufacture of semiconductor integrated circuits that include ferroelectric films, because it is contemplated that such implementation is particularly advantageous in that context. However, it is also contemplated that those skilled in the art having reference to this specification will recognize that concepts of this invention may be beneficially applied to other applications. Accordingly, it is to be understood that the following description is provided by way of example only, and is not intended to limit the true scope of this invention as claimed.

Figure 1:
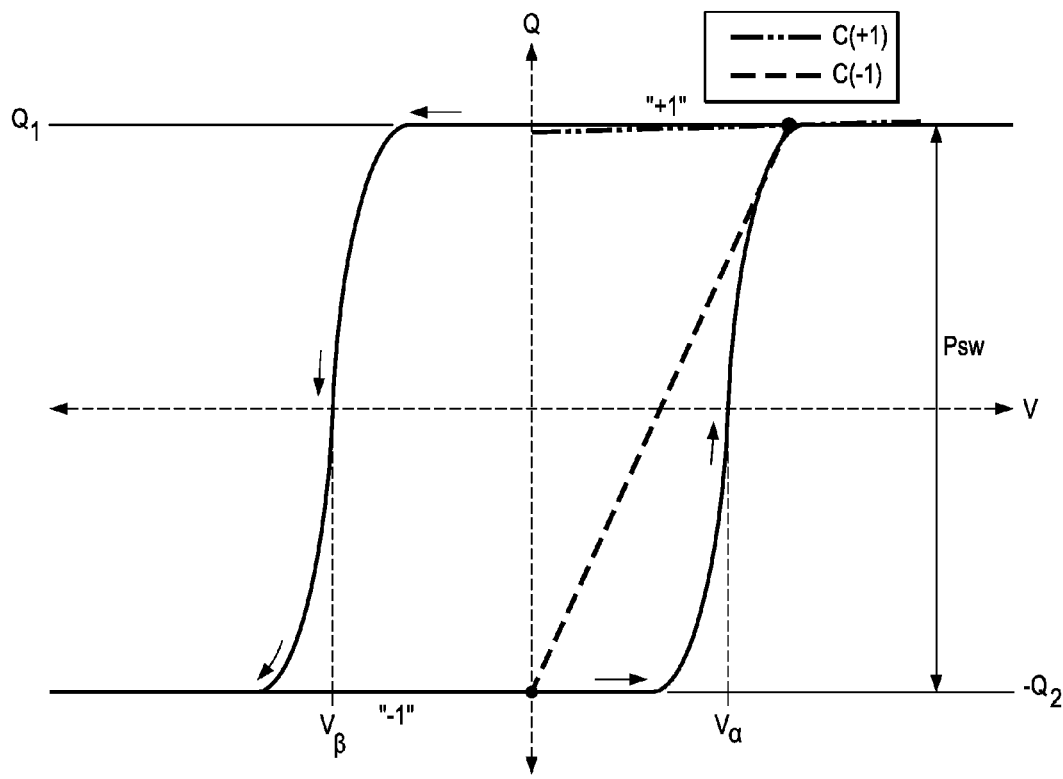
FIG. 1 is a hysteresis diagram illustrating the electrical behavior of a conventional ferroelectric capacitor.
Figure 2:
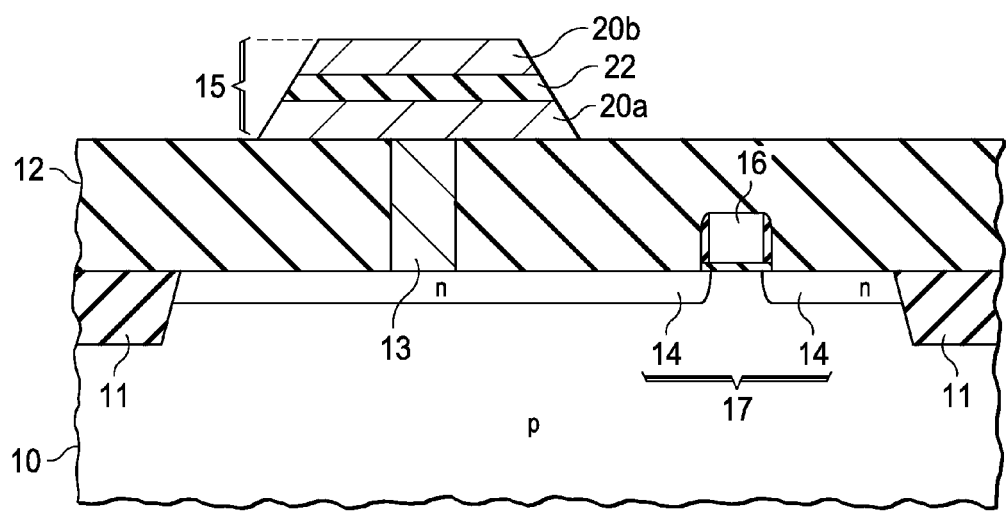
FIG. 2 is a cross-sectional view of a portion of an integrated circuit including a ferroelectric capacitor at a selected stage of manufacture according to embodiments of this invention.

For purposes of context, FIG. 2 illustrates, in cross-section, a portion of an integrated circuit including a portion of a ferroelectric random access memory (FRAM), as may be constructed using embodiments disclosed in this specification. In this example, ferroelectric capacitor 15 and metal-oxide-semiconductor (MOS) transistor 17 are disposed at or near a semiconducting surface of a semiconductor substrate. Alternatively, these embodiments may be used in the fabrication of integrated circuits in which a semiconductor layer itself overlies an insulator layer, such as according to a silicon-on-insulator (SOI) technology, as known in the art.

In the example of the integrated circuit shown in FIG. 2, isolation dielectric structures 11, gate electrode 16, and n-type source/drain regions 14 are disposed at or near the surface of substrate 10, in the conventional manner for MOS integrated circuits, as well-known in the art. N-channel MOS transistor 17 in the example of FIG. 2 includes n-type source/drain regions 14 at the surface of p-type substrate 10 (or of a p-type "well" formed into substrate 10, as the case may be), with gate electrode 16 overlying a channel region between source/drain regions 14, and separated from the channel region by a gate dielectric, as conventional. Interlevel dielectric 12 is disposed over transistor 17, with conductive plug 13 disposed in a contact opening through interlevel dielectric 12 to provide a conductive connection between one of source/drain regions 14 of transistor 17 and lower plate 20a of ferroelectric capacitor 15.

In the example of FIG. 2, ferroelectric capacitor 15 is formed of a ferroelectric "sandwich" stack of conductive plates 20a, 20b, between which ferroelectric material 22 is disposed. Lower plate 20a is formed at a location overlying conductive plug 13, as shown in FIG. 2, so as to be in electrical contact with the underlying source/drain region 14 by way of conductive plug 13. Conductive plates 20a, 20b are typically formed of the same conductive material or materials as one another. Often, conductive plates 20a, 20b are formed as stacks of conductive metals, metal oxides, and the like. For example, one such stack forming lower plate 20a may include a conductive diffusion barrier (e.g., TiN, TiAlN, TiAlON, TaSiN, CrN, HfN, TaN, HfAlN, CrAlN, TiSiN, CrSiN) in contact with conductive plug 13, an intermediate layer of a noble metal (e.g., Ru, Pt, Ir, Rh, Pt, Pd, Au) or noble metal oxide (e.g., RuOx, IrOx, PdOx) disposed over the diffusion barrier, and a conductor such as iridium (Ir) or strontium ruthenate ($SrRuO_3$) overlying the intermediate layer and in contact with the ferroelectric material 22. Lower conductive plate 20a and upper conductive plate 20b are formed of the same material or materials, for purposes of symmetry, simplicity of the manufacturing flow, and improved ferroelectric polarization performance. In that case, the order in which the various materials of upper conductive plate 20b are formed will be reverse that of lower plate 20a. Lower conductive plate 20a and upper conductive plate 20b are typically formed by way of sputter deposition.

According to embodiment disclosed in this specification, ferroelectric material 22 is lead-zirconium-titanate, commonly referred to as PZT. It is desirable for ferroelectric material 22 in capacitor 15 to be as thin as practicable, for purposes of electrical performance (e.g., capacitance), and for consistency with the deep sub-micron features used to realize modern integrated circuits. According to the embodiments disclosed in this specification, PZT ferroelectric material 22 is deposited by way of metalorganic chemical vapor deposition.

Figure 3:
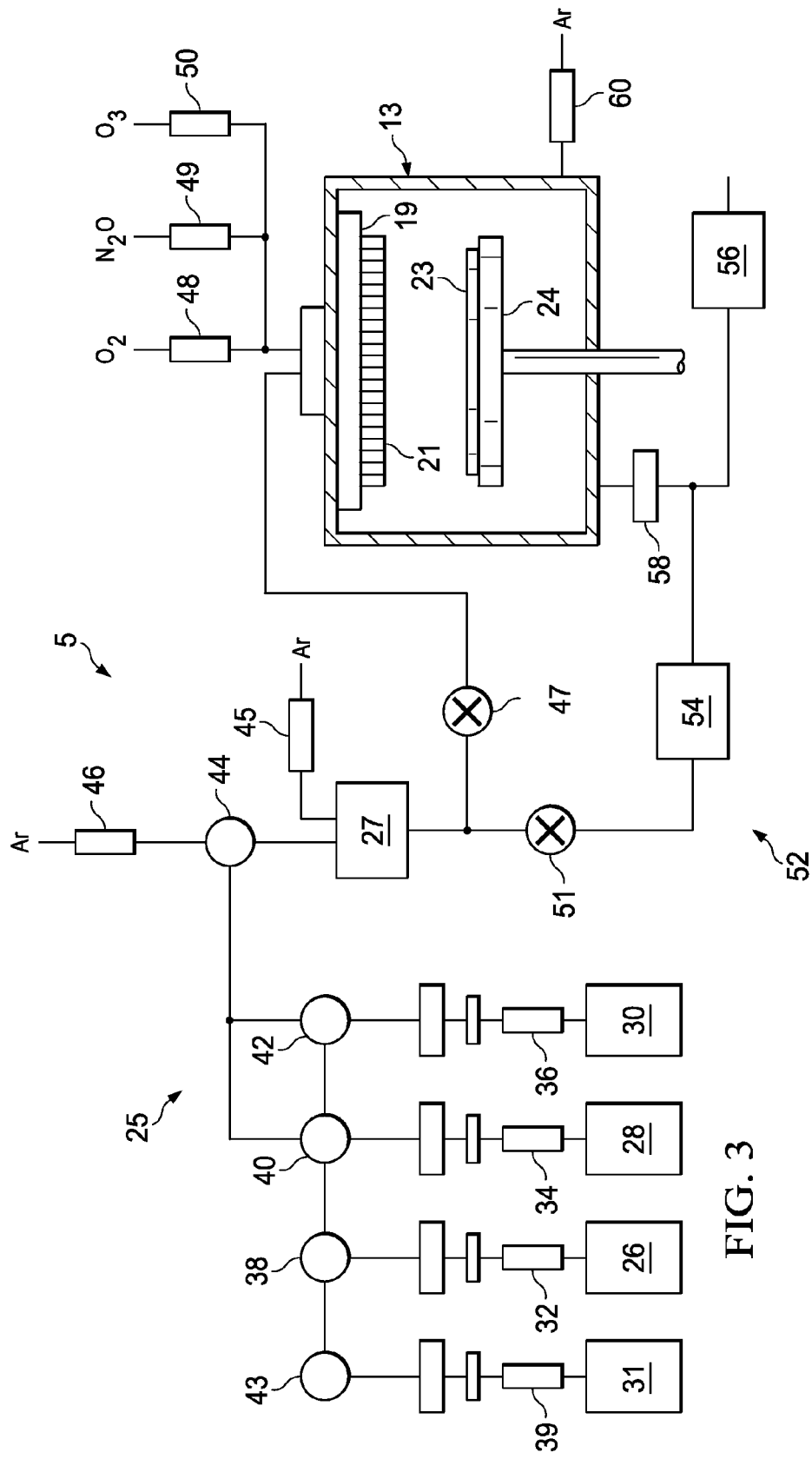
FIG. 3 is a schematic diagram illustrating a chemical vapor deposition system for forming a ferroelectric film according to disclosed embodiments.

FIG. 3 schematically illustrates the functional arrangement of an example of CVD system 5 for forming PZT films by liquid delivery metalorganic chemical vapor deposition according to embodiments of this invention. This example of CVD system 5 described in this specification and in U.S. Pat. No. 6,730,354, incorporated herein by reference, is provided by way of context to the disclosed embodiments, as an example of a suitable system for depositing PZT ferroelectric material 22 according to those embodiments. It is of course contemplated that those skilled in the art having reference to this specification will readily comprehend that variations and alternatives to some or all of the elements of CVD system 5, and other types of MOCVD systems, may alternatively be used, such variations and alternatives remaining within the scope of the claims below.

This example of CVD system 5 includes chemical vapor deposition (CVD) chamber 13 coupled to dual precursor ampoule liquid delivery system 25 and vaporizer 27. CVD chamber 13 may, for example, be implemented as a conventional commercially available CVD chamber for wafers of the desired diameter (e.g., 200 mm, 300 mm, etc.). In this example, CVD chamber 13 includes gas distribution manifold 19 and showerhead 21, configured to introduce PZT precursor vapor into CVD chamber 13 under the appropriate conditions, from which PZT ferroelectric material 22 precipitates onto an exposed surface of wafer 23. Wafer 23 is supported by heated susceptor 24, which is spaced apart from showerhead 21, typically by several millimeters. The exposed surface of wafer 23 may correspond to the top surface of a silicon wafer, a layer of silicon dioxide formed on a silicon wafer, gallium arsenide, magnesium oxide, sapphire, or the top surface of a multilayer structure that includes, for example, a complex integrated circuit that is formed on a semiconductor wafer. Referring to the structure shown in FIG. 2, for example, wafer 23 when placed into chamber 13 corresponds to substrate 10 after the formation of transistor 17, interlevel dielectric 12, conductive plug 13, and lower plate 20a; at that stage of manufacture, the conductive layer or layers making up lower plate 20a extend across the entire surface of wafer 23, according to conventional processes in which the plates 20a, 20b and PZT ferroelectric material 22 are etched as a stack.

In the example of CVD system 5 shown in FIG. 3, liquid delivery system 25 includes solvent ampoule 31, and source reagent ampoules 26, 28, 30 containing respective metalorganic compounds or mixtures of the component metals needed to form PZT films. In some embodiments, source reagent ampoule 26 will contain the lead precursor, source reagent ampoule 28 will contain the zirconium precursor, and source reagent ampoule 30 will contain the titanium precursor; alternatively, one ampoule may contain a mixture of the zirconium and titanium precursors, or further in the alternative, a single ampoule may contain the precursors for all three of lead, zirconium, and titanium. Examples of particular precursors for lead, zirconium, and titanium, and of the solvent to be introduced into chamber 13 for deposition, are described in the above-incorporated U.S. Pat. No. 6,730,354.

Referring back to the example of FIG. 2, source reagent and solvent ampoules 26, 28, 30, 31 are coupled to respective liquid flow controllers 32, 34, 36, 39, which are configured to meter precise quantities of fluid into manifolds 38, 40, 42, 43, respectively. The metered solvent and metalorganic mixtures are delivered to final mixing chamber 44, for mixing into a liquid PZT precursor composition. This precursor composition is introduced into vaporizer 27 for vaporizing into a precursor vapor, for example by flash vaporization on a vaporization element heated to a suitable temperature. Gas flow controller 46 controls the flow of a carrier gas (e.g., argon gas or helium gas), which transports the precursor vapor into CVD chamber 13 via valve 47. An additional push gas source (e.g., argon or helium) also may be connected directly to vaporizer 27 via gas flow controller 45. Gas flow controllers 48, 49, 50 meter precise quantities of oxidizing co-reactant gases (e.g., $O_2$, $O_3$, $N_2O$, or a combination of one or more of these gases) into gas distribution manifold 19, where the oxidizing gases mix with the precursor vapor before being introduced into CVD chamber 13.

CVD system 5 also includes components used to evacuate and purge of chamber 13. As described in the above-incorporated U.S. Pat. No. 6,730,354, by way of example, these components include purge gas flow control 60 and purge valve 47, and evacuation system 52 that includes cold traps 54, 56, 58, and valve 51. Other conventional features may be included in CVD system 5 for purposes of PZT deposition according to the embodiments disclosed in this specification, including those described in further detail in the above-incorporated U.S. Pat. No. 6,730,354.

Figure 4:
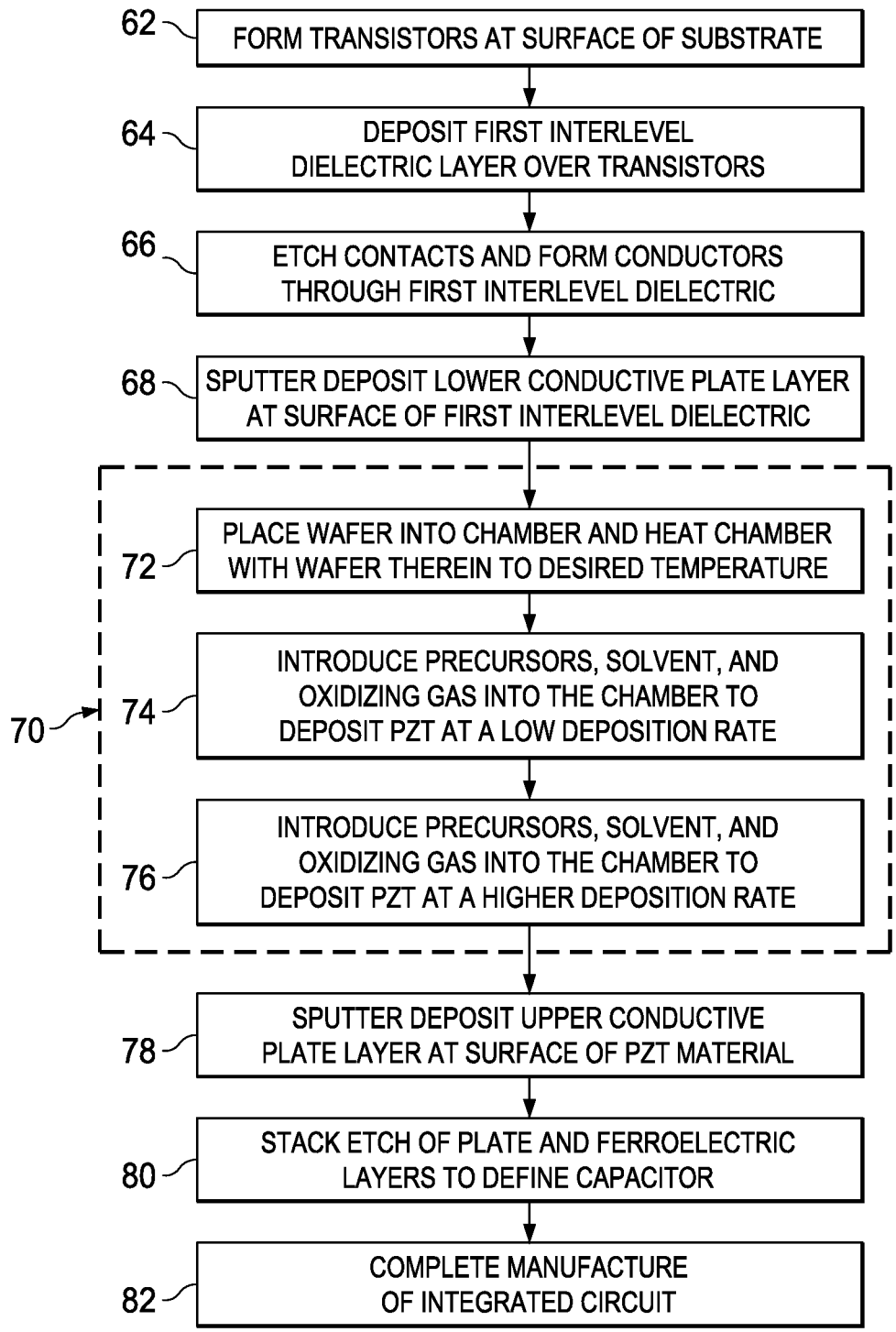
FIG. 4 is a flow diagram illustrating a process of forming a ferroelectric capacitor according to disclosed embodiments.

Referring now to FIG. 4, a process of fabricating an integrated circuit including one or more ferroelectric capacitors 15 such as shown in FIG. 2 will now be described, in connection with several embodiments of that process. In process 62 shown in FIG. 4, transistors such as transistor 17 are formed at or near the semiconducting surface of substrate 10 or other support body, in the conventional manner. As part of process 62, isolation dielectric structures 11, the appropriate doped wells (not shown), a gate dielectric layer, gate electrodes 16, and source/drain regions 14, among other structures, are formed at or near the surface of substrate 10 according to conventional MOS processes. N-channel MOS transistor 17 shown in FIG. 2 may be formed in the conventional manner by deposition and photolithographic patterning and etch of polysilicon material to define gate electrode 16 overlying a gate dielectric, with n-type source/drain regions 14 formed on either side of gate electrode 16 by ion implantation and subsequent activation anneal, in the well-known self-aligned manner.

In process 64, first interlevel dielectric 12 is then deposited over the transistors such as transistor 17 that were formed in process 62, for example by way of chemical vapor deposition, followed by planarization if desired. In process 66, contact openings (i.e., vias) are etched through first interlevel dielectric 12 at selected locations, and conductive plugs 13 are formed into those openings in the conventional manner to provide an electrical contact between one of source/drain regions 14 of MOS transistor 17 and the eventual ferroelectric capacitor 15. Conductive plug 13 may be formed of a metal such as tungsten, titanium, and the like, or an alloy thereof, Following the formation of first interlevel dielectric layer 12 in process 64, and the contact etch and conductor formation in process 66, ferroelectric capacitor 15 is then formed in this example. In process 68, one or more conductive layers are formed over first interlevel dielectric layer 12 and conductive plugs 13, to serve as the lower conductive plate layer for capacitor 15. Typically, process 68 will be performed by sputter deposition of one or more layers of the desired conductive material, such as one or more of strontium ruthenate (SrRuO$_3$), iridium (Ir), iridium oxide (IrO$_2$), platinum (Pt), and other metals and metal oxides suitable for use in this application, along with the appropriate barrier metal layers disposed between the lower conductive plate layer and underlying structures, as conventional in the art. In many implementations, the particular conductors deposited in process 68 are selected for compatibility with the PZT ferroelectric material to be deposited over this layer, with the temperatures and other conditions that the structure will be exposed to in the remainder of the manufacturing process.

Following the deposition of the lower conductive plate layer in process 68, PZT ferroelectric material 22 is deposited overall by way of metalorganic chemical vapor deposition, in process 70. According to embodiments disclosed in this specification, and as mentioned above, it is contemplated that process 70 will be carried out by way of a chemical vapor deposition system such as CVD system 5 described above, or variations and alternatives thereto. These systems are typically single-wafer systems, and as such it is contemplated that the necessary and conventional evacuation and purge operations will be performed as appropriate for the particular system prior to the performing of PZT deposition process 70 upon a given wafer. Alternatively, if the CVD system being used is arranged to accept multiple wafers, more than one such wafer may be subjected to process 70 simultaneously. In the following description, the operation of process 70 will be described with reference to the example of single-wafer CVD system 5 described above relative to FIG. 3, it being contemplated that those skilled in the art having reference to this specification will be readily able to adapt the particular operations as appropriate for such variations in the CVD system presented in each specific implementation, without undue experimentation.

Referring to FIG. 4, deposition process 70 will first be described in a generalized sense. As shown, process 70 begins with the placement of wafer 23, including substrate 10 and the previously formed elements as discussed above, into chamber 13, and the heating of the interior of chamber 13 and wafer 23 to the desired temperature, in process 72. Wafer 23 is typically preheated during a preheating period prior to deposition, for example with part of this preheating performed prior to its placement on its placement on heated susceptor 24. The above-incorporated U.S. Pat. No. 6,730,354 describes one approach for gradually heating wafer 23 to the desired processing temperature within chamber 13. It is contemplated that the manner in which wafer 23 and chamber 13 reach the desired processing temperature in process 72 can be carried out in any one of a number of ways for purposes of the disclosed embodiments. In any case, process 72 raises chamber 13 and wafer 23 to the desired temperature prior to the initiation of deposition process 74.

Following process 72, with wafer 23 at the desired temperature, the deposition of PZT ferroelectric material 22 begins with first deposition process 74. In a generalized sense, process 74 is performed by introducing into chamber 13 precursors and solvent at the desired flow rate, and oxidizing gas of the desired mixture, where reactions among those constituents result in the deposition of PZT onto wafer 23. According to disclosed embodiments, the precursor and solvent flow rate, the oxidizing gas composition, and the conditions present in chamber 13, are selected for this process 74 to result in a relatively low deposition rate of the PZT material onto wafer 23. In some of the disclosed embodiments, process 74 is continued for a first selected time duration. As a result of process 74, a first, lower, portion of the layer of PZT ferroelectric material 22 is deposited.

Following first deposition process 74, second deposition process 76 is then performed to continue the deposition of the PZT layer. Again, deposition process 76, is performed by introducing precursors, solvent, and oxidizing gas of a desired mixture into chamber 13. According to disclosed embodiments, the deposition conditions (e.g., precursor flow rate, oxidizing gas composition, temperature, etc.) in process 76 differ from those in process 74 so that PZT material is deposited onto wafer 23 at a higher rate than in process 74. In the disclosed embodiments, high deposition rate process 76 continues for a second selected time duration, resulting in the deposition of a second, upper, portion of the layer of PZT ferroelectric material 22. According to some disclosed embodiments, process 76 completes the deposition of PZT ferroelectric material 22 to its full thickness.

As mentioned above, the deposition conditions during process 76 differ from those during process 74, so that the deposition rate in process 76 is higher than that in process 74. As will now be described with reference to FIGS. 5a through 5d, embodiments of the invention may utilize different approaches, and combinations of those approaches, to implement deposition processes 74, 76 at differing deposition rates.

Figure 5A:
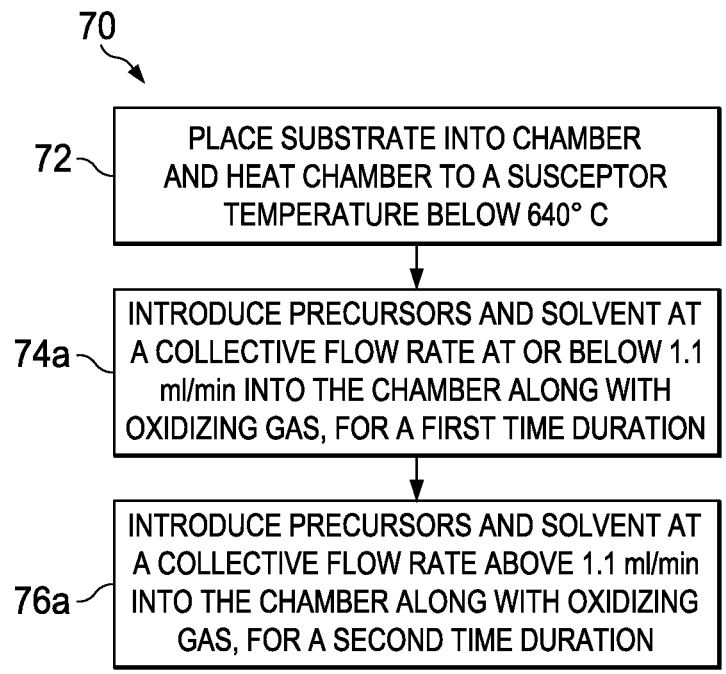
FIGS. 5a through 5d are flow diagrams illustrating a process of depositing lead-zirconium-titanate (PZT) ferroelectric material according to respective ones of the disclosed embodiments.

In FIG. 5a, PZT deposition process 70 begins with process 72, in which wafer 23 is placed into chamber 13, and chamber 13 is heated to the desired processing temperature. As known in the art, the processing temperature for CVD is typically measured at the susceptor upon which the wafer is placed for deposition, at which temperature sensors can be installed. Accordingly, the susceptor temperature is commonly used in the art to refer to the processing temperature; the actual temperature at the surface of the wafer will generally be less than this temperature of the susceptor, for example on the order of 20 deg C. This specification will follow that convention, and will refer to the susceptor temperature as the processing temperature in describing the embodiments of process 70. It is contemplated that those skilled in the art, having reference to this specification, will readily comprehend the temperature at which processing is being carried out for their particular implementation of the CVD system and process, based on this description in which the temperature at susceptor 24 of chamber 13 is used as the reference temperature. According to the embodiment shown in FIG. 5a, process 72 heats chamber 13 to a temperature, at susceptor 24, below about 640 deg C., for example at about 635 deg C. As described above and as known in the art, heating process 72 is performed with wafer 23 in chamber 13, and may be performed in multiple stages (e.g., including a preheating step in which wafer 23 is supported above susceptor 24, as described in the above-incorporated U.S. Pat. No. 6,730,354). Other conditions at chamber 13, such as pressure (e.g., at 2 torr), as suitable for CVD of PZT are also effected in this process 72.

With chamber 13 and wafer 23 at the desired temperature through the operation of process 72, deposition process 74a is then performed to deposit a first thickness of PZT ferroelectric material 22 at the surface of the layer of lower conductive plate 20a material, with the deposition occurring at a relatively low deposition rate. In this embodiment, process 74a is performed by introducing the lead, zirconium, and titanium precursors, and the solvent, at a relatively low flow rate. As known in the art, the flow rates for liquid precursor reactants are referred to by fluid flow units, such as ml/min. In one example of this embodiment, low deposition rate process 74a is carried out by introducing all precursors (lead, zirconium, and titanium) and the solvent from ampoules 26, 28, 30, 31 via vaporizer 27 at a collective flow rate at 1.1 ml/min or below. During the introduction of the precursors and solvent, oxidizing gas is introduced into chamber 13 via one or more of gas flow controllers 48, 49, 50, according to the desired chemistry, along with carrier gas via gas flow controller 46 if desired. Process 74a, at this flow rate and under these conditions, continues for a time duration selected according to the thickness of PZT to be deposited at this low deposition rate. For example, it is contemplated that the duration of process 74a will typically be on the order of from about 100 seconds to about 300 seconds. An expected deposition rate for this process 74a, under these conditions, will be about 0.5 to 1.5 Å/sec.

Following low deposition rate process 74a over the selected duration, deposition of PZT ferroelectric material 22 at a higher deposition rate is then performed in process 76a. According to this embodiment, the higher deposition rate is achieved by increasing the collective flow rate of the precursors and solvent relative to that of process 74a. In one example of this embodiment, high deposition rate process 76a is performed by introducing all precursors (lead, zirconium, and titanium) and the solvent from ampoules 26, 28, 30, 31 via vaporizer 27 at a collective flow rate above 1.1 ml/min, for example at a rate between about 1.5 ml/min to about 2.5 ml/min, in combination with the oxidizing gas and the carrier gas as described above. The introduction of these reactants and carrier gas into chamber 13, and the resulting PZT deposition, continues in process 76a for a time duration selected according to the desired overall thickness of PZT ferroelectric material 22, for example for a time between about 150 seconds to about 250 seconds. An expected deposition rate for this process 74a, under these conditions, will be about 1.5 to 3.0 Å/sec.

The duration of low deposition rate process 74a relative to that of high deposition rate process 76a determines the proportion of PZT ferroelectric material 22 deposited in low deposition rate process 74a to that deposited in high deposition rate process 76a. The relative thicknesses of these constituent sub-layers of PZT ferroelectric material 22 can vary widely, for example from about 10% to about 50% of the overall thickness formed by low deposition rate process 76a.

Figure 6A:
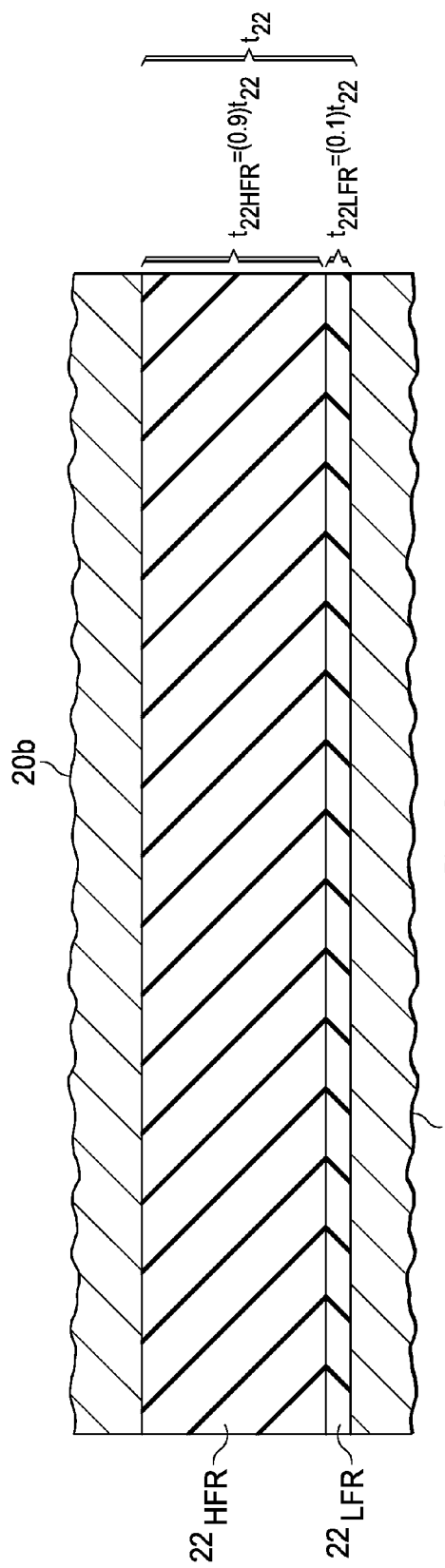
FIGS. 6a and 6b are cross-sectional views of a portion of an integrated circuit including a ferroelectric film deposited according to respective ones of the disclosed embodiments.
Figure 6B:
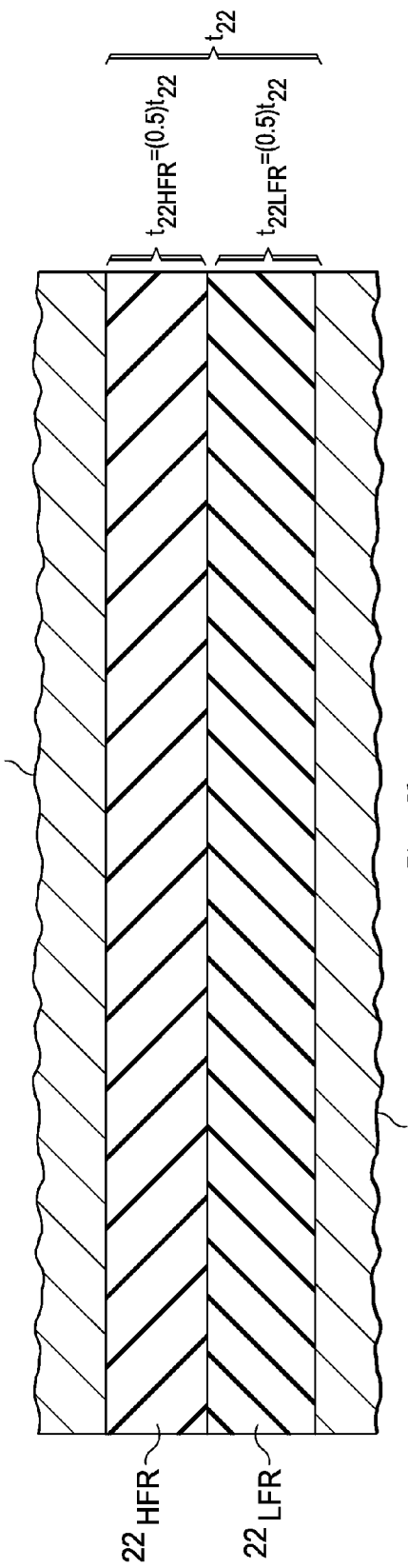

FIGS. 6a and 6b illustrate examples of PZT ferroelectric material 22 as formed according to embodiments of this invention, but at different relative deposition times for processes 74a, 74b in this embodiment. In each of FIGS. 6a and 6b, PZT ferroelectric material 22 is shown as deposited over lower conductive plate layer 20a, and underlying upper conductive plate layer 22a. PZT ferroelectric material 22 in the example of FIG. 6a includes a relatively thin PZT layer $22_{LFR}$ formed in low deposition rate process 74a in contact with lower conductive plate layer 20a, and a relatively thick PZT layer $22_{HFR}$ formed in high deposition rate process 76a overlying PZT layer $22_{LFR}$ and underlying upper conductive plate layer 20b. In this example, the thickness $t_{22LFR}$ of PZT layer $22_{LFR}$ is about one-tenth the overall thickness $t_{22}$ of PZT ferroelectric material 22, with PZT layer $22_{HFR}$ at a thickness $t_{22HFR}$ that is about nine-tenths the overall thickness $t_{22}$. In this example, accordingly, the duration of low deposition rate process 74a is no greater than that of high deposition rate process 76a, for example as short as one-half the duration of high deposition rate process 76a. Conversely, in the example of FIG. 6b, PZT layer $22_{LFR}$ formed in low deposition rate process 74a is about the same thickness as PZT layer $22_{HFR}$ formed in high deposition rate process 76a, for example with thicknesses $t_{22LFR}$ and $t_{22HFR}$ each at about one-half the overall thickness $t_{22}$. To form a structure such as shown in FIG. 6b, it is contemplated that the time duration of low deposition rate process 74a will be longer than that of high deposition rate process 76a, for example twice as long, to construct layers $22_{LFR}$, $22_{HFR}$ at the same thickness, given the different deposition rates. It is contemplated that those skilled in the art having reference to this specification will be readily able to select the deposition times for processes 74a, 74b appropriate to result at the relative thickness desired for a particular implementation, without undue experimentation. Of course, the throughput benefit of depositing PZT by way of a high deposition rate process 76b will be largely mitigated if a large fraction of the overall PZT thickness is deposited in low deposition rate process 74a.

It is contemplated that differences in the surface morphology, crystalline structure, or other physical attributes between PZT layer $22_{LFR}$ formed in low deposition rate process 74a and PZT layer $22_{HFR}$ formed in high deposition rate process 76a, according to disclosed embodiments, will typically be present in the finished PZT ferroelectric material 22. In many instances, it is contemplated that these physical differences may be observable using modern analytical techniques such as transmission electron microscopy (TEM) and other atomic-level microscopic technologies.

Figure 5B:
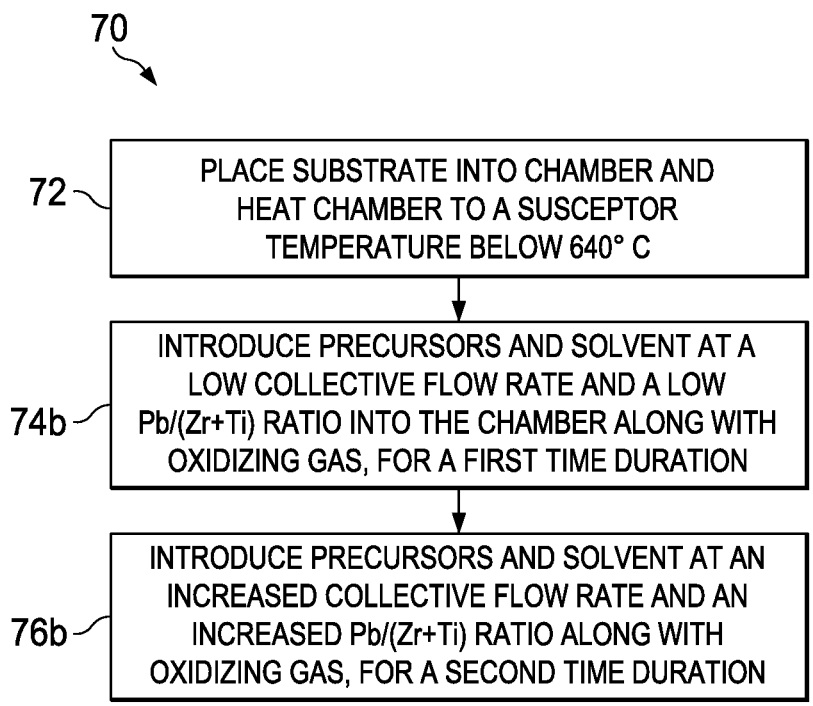

FIG. 5b illustrates an alternative embodiment, in which the composition of PZT ferroelectric material 22 also varies, along with the rate at which it was deposited. In this embodiment, heating process 72 is performed as described above relative to FIG. 5a, elevating the temperature of the interior of chamber 13 to a temperature below about 640 deg C., as measured at susceptor 24. In this embodiment, low deposition rate process 74b again introduces the precursors (lead, zirconium, titanium) and the solvent at a low collective flow rate, and at a selected ratio of the precursors among themselves, along with oxidizing gas as described above; the deposition conditions in chamber 13 otherwise correspond to those described above for process 74a of FIG. 5a. As known in the art, lead-zirconium-titanate typically has a perovskite crystalline structure, in which lead is generally assigned to the "A" sites of the crystal unit cell, while zirconium and titanium are assigned to the "B" cell sites. Also as known in the art, the stoichiometry of PZT material can somewhat vary, and as such the A/B ratio of deposited PZT can vary in a way that is dependent on the relative flow rates of the "A" constituent (Pb) to the "B" constituents (Zr and Ti). The properties of PZT ferroelectric material have been observed to vary with the A/B ratio; specifically, high lead content (i.e., a high A/B ratio) has been observed to provide a film with high switching polarization Psw but high leakage current, while a lower lead content (i.e., a lower A/B ratio) results in PZT with lower switching polarization Psw but also lower leakage levels. According to the embodiment illustrated in FIG. 5b, low deposition rate process 74b introduces the precursors (lead, zirconium, titanium) and the solvent at a collective flow rate at or below 1.1 ml/min, as in process 74a of FIG. 5a, with a selected flow rate of lead from ampoule 26 and selected flow rates of zirconium and titanium from ampoules 28, 30, respectively, that results in a relatively low Pb/(Zr+Ti) (i.e., A/B) ratio, for example about 1.06. Again, low deposition rate process 74b continues for a selected time duration to deposit a first portion of PZT ferroelectric material 22 to the desired thickness.

High deposition rate process 76b is then performed, by increasing the collective flow rate of the precursors (lead, zirconium, titanium) and the solvent, in which the relative flow rates of lead, zirconium, and titanium are changed to a higher Pb/(Zr+Ti) (i.e., A/B) ratio. In one example of this embodiment, the collective flow rate of the precursors and solvent in process 76b can range from about 1.5 ml/min. to about 2.5 ml/min., and the Pb/(Zr+Ti) (i.e., A/B) ratio is about 1.10. Under these conditions, high deposition rate process 76b is performed for another selected time duration, in the presence of oxidizing gas, to complete the deposition of PZT ferroelectric material 22 to the desired overall thickness.

As a result of this embodiment, it is contemplated that the structure of the PZT ferroelectric material 22 deposited in processes 74b, 76b will differ in composition, specifically in the lead content of the resulting portions of the overall film. As a result, it is contemplated that the performance of the resulting PZT ferroelectric material 22 can reflect positive attributes of the structure of each portion, namely the high switching polarization Psw of the upper lead-rich portion of the layer, and also the low leakage characteristics of the lower portion with lower lead content. In addition, despite both deposition processes 74b, 76b being carried out at a low deposition temperature (i.e., below about 640 deg C.), the resulting PZT ferroelectric material 22 has been observed to be substantially free of the "haze" defects to which low temperature PZT films are vulnerable, and which adversely affect device yield. Indeed, it has been observed from experiments that the switching polarization of PZT ferroelectric material deposited according to this embodiment is higher than that of a single PZT layer deposited under the higher (e.g., 1.10) A/B ratio and higher deposition rate conditions of process 76b throughout, and at a device yield at least as high as that attained by a single PZT layer deposited with lower collective flow rate conditions of process 74b throughout. It is contemplated that the differences in lead composition between the low deposition rate and high deposition rate portions of PZT ferroelectric material 22, deposited according to this embodiment, can be observed using modern analytical equipment.

Figure 5C:
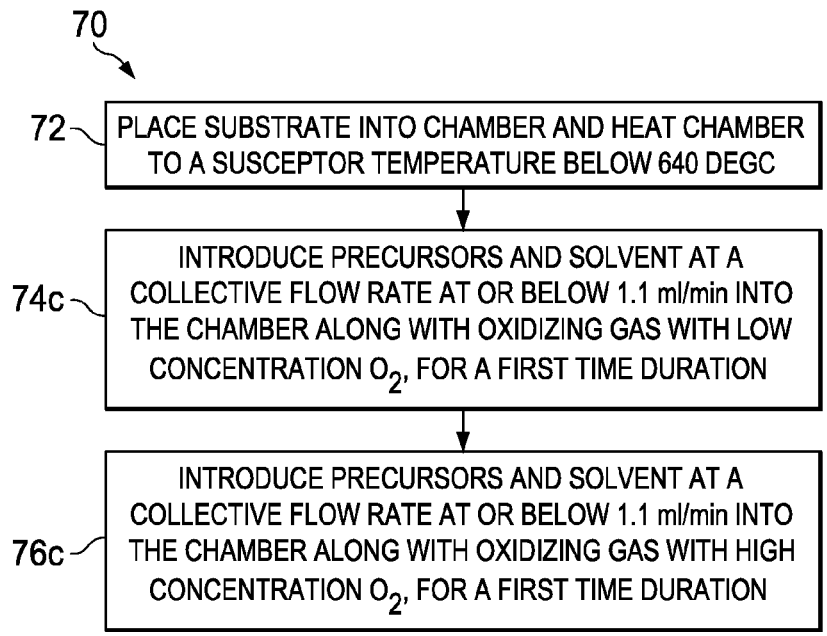

Referring now to FIG. 5c, PZT deposition process 70 according to another embodiment will be described. Heating process 72 is performed as described above relative to FIGS. 5a and 5b, in which the temperature of chamber 13 containing wafer 23 is raised to a susceptor temperature below about 640 deg C., under similar pressure and other conditions as described above relative to FIG. 5a. Low deposition rate process 74c is then performed, in which the precursors (lead, zirconium, titanium) and the solvent are introduced at a low collective flow rate, for example at or below about 1.1 ml/min. According to this embodiment, the oxygen concentration in the oxidizing gas introduced during low deposition rate process 74c is relatively low. In one example of this embodiment, the oxygen concentration of the oxidizing gas introduced in process 74c is about 33% $O_2$, with the rest of the oxidizing gas made up of a diluting inert gas, such as argon; in this example, this diluted oxidizing gas is introduced as the combination of $O_2$ at a flow rate of about 1500 sccm and Ar at a flow rate of about 3000 sccm. As before, low deposition rate process 74c is performed for a selected time duration to deposit a first portion of PZT ferroelectric material 22 at the desired thickness.

Upon completion of low deposition rate process 74c, high deposition rate process 76c is then performed by increasing the collective flow rate of the precursors (lead, zirconium, titanium) and the solvent to from about 1.5 ml/min. to about 2.5 ml/min, for example. Also, in this embodiment, the oxygen concentration in the oxidizing gas is increased relative to that in process 74c, for example to 100% oxygen with no inert gas dilution (e.g., $O_2$ at 4500 sccm, and Ar at 0 sccm). This increase in oxygen concentration is contemplated to increase the oxidation reaction rate, and thus the rate at which the PZT material is deposited. Other conditions in chamber 13 may be maintained as in process 74c. High deposition rate process 76c is then performed for its selected time duration, completing the deposition of the desired overall thickness of PZT ferroelectric material 22.

Figure 5D:
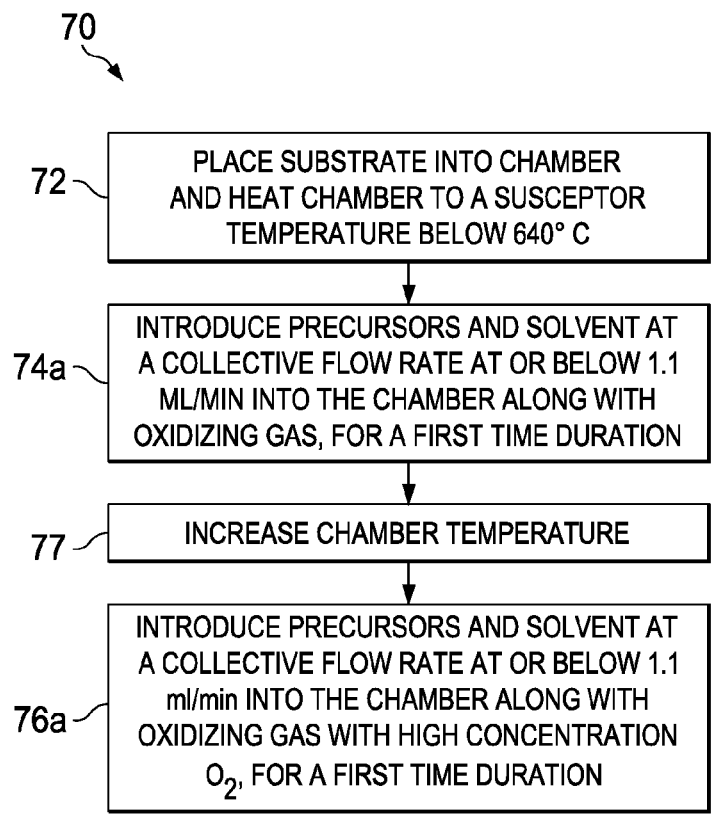

FIG. 5d illustrates PZT deposition process 70 according to another embodiment. In this embodiment, heating process 72 is performed as described above relative to FIG. 5a, elevating the temperature of the interior of chamber 13 to a susceptor temperature below about 640 deg C. Low deposition rate process 74a is then performed according to this embodiment, in which the precursors (lead, zirconium, titanium) and the solvent are introduced at a low collective flow rate, for example at or below 1.1 ml/min, along with oxidizing gas, and under the appropriate deposition conditions in chamber 13 as described above. This low deposition rate process 74a continues for a selected time duration to deposit a first portion of PZT ferroelectric material 22 to the desired thickness, as discussed above.

According to this embodiment of FIG. 5d, process 77 is then performed to increase the temperature of chamber 13 and wafer 23. For example, it is contemplated that the temperature at susceptor 24 may be raised, in process 77, from about 635 deg C. to about 645 deg C. Once the desired higher susceptor temperature (and thus wafer and chamber temperature) is reached, high deposition rate process 76a is then performed to deposit the upper portion of PZT ferroelectric material 22 at an increased collective flow rate of the precursors (lead, zirconium, titanium) and the solvent, for example ranging from about 1.5 ml/min. to about 2.5 ml/min. as described above. High deposition rate process 76b is performed for another selected time duration, in the presence of oxidizing gas, to complete the deposition of PZT ferroelectric material 22 to the desired overall thickness.

Other alternatives and variations to the embodiments described above relative to FIGS. 5a through 5d are contemplated. These alternatives and variations include changing a combination of deposition conditions (i.e., flow rate, A/B ratio, oxygen concentration, temperature, etc.) between the low deposition rate and high deposition rate processes. For example, all of the conditions of flow rate, A/B ratio, oxygen concentration, and temperature may be changed from those used in the low deposition rate process to perform the high deposition rate process; other variations contemplated include the changing of some subcombination of those conditions. Further in the alternative, it is contemplated that more than two deposition processes may be performed, such as a low deposition rate process followed by a medium deposition rate process, which in turn is followed by a high deposition rate process. Further in the alternative, it is contemplated that one or more of the deposition conditions may be changed in a continuous fashion during deposition, resulting in a "single" deposition process that begins under low deposition rate conditions and finishes under higher deposition rate conditions. These and other alternatives and variations to the disclosed embodiments, as will be apparent to those skilled in the art having reference to this specification, are contemplated to be within the scope of the invention as claimed.

Referring back to FIG. 4, upon completion of PZT deposition process 70 according to one of the embodiments, upper conductive plate layer 20b is then deposited over PZT ferroelectric material 22 in process 78. It is contemplated that the composition of upper conductive plate layer 20b will typically be the same as that of lower conductive plate layer 20a, for symmetry and to allow the use of the same materials and processes for each. If lower and upper conductive plate layers 20a, 20b are composed of a stack of multiple conductive materials, the order of those materials in layers 20a, 20b will typically be reversed. It is contemplated that deposition process 78 will typically be performed by sputter deposition, although other techniques for depositing conductive materials may alternatively be used.

In process 80, ferroelectric capacitor 15 is then completed by photolithographic patterning of photoresist or another mask layer to define its size and location, followed by a single masked stack etch of conductive plates 20*a*, 20*b*, and ferroelectric material 22. Commonly assigned U.S. Pat. No. 6,656,748, incorporated herein by reference, describes an example of ferroelectric stack formation and etch process 80, suitable for use in connection with embodiments of this invention. Additional processing to complete ferroelectric capacitor 15, such as the formation of passivation films such as described in commonly assigned copending U.S. patent application Ser. No. 13/432,736, incorporated herein by this reference, may also be performed. The manufacture of the integrated circuit is then completed in process 82, by conventional processes for forming the various levels of interlevel dielectrics, conductors, and the like.

The disclosed embodiments can enable one or more advantages in the manufacture of ferroelectric materials and integrated circuits incorporating those materials, as compared with conventional deposition processes and technologies. In particular, the disclosed embodiments enable the deposition of a ferroelectric material with high switching polarization in combination with low leakage characteristics. By depositing at least a portion of the ferroelectric material at a relatively high deposition rate, according to these embodiments, the overall deposition rate attainable by the disclosed embodiments is significantly higher than that of a low deposition rate single layer film; as a result, the manufacturing throughput of the ferroelectric deposition process can significantly increase, for example by on the order of 30 to 80%. In addition, the ferroelectric material deposited according to disclosed embodiments has been observed to be substantially free of the "haze" defects that often occur at low deposition temperatures, such as below about 640 deg C. Furthermore, the disclosed embodiments are capable of depositing a ferroelectric film that can be readily scaled to thicknesses on the order of 100A and thinner, as compatible with modern integrated circuits with feature sizes in the deep sub-micron region. It is contemplated that these and other important benefits may be enabled by the disclosed embodiments.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit including a ferroelectric capacitor, comprising the steps of:
   depositing a first conductive film near a semiconducting surface of a body;
   then depositing ferroelectric material over the first conductive film by metalorganic chemical vapor deposition comprising the steps of:
      for a first time duration, introducing precursors of lead, zirconium, and titanium, and a solvent, at a first collective flow rate, and an oxidizing gas, into a chamber containing the body; and
      then, for a second time duration, introducing into the chamber the precursors of lead, zirconium, and titanium, and a solvent, at a second collective flow rate greater than the first collective flow rate, and an oxidizing gas;
   depositing a second conductive film overlying the ferroelectric material; and
   removing portions of the first and second conductive films, and the ferroelectric material, at selected locations, to define the ferroelectric capacitor.

2. The method of claim 1, wherein the first collective flow rate is at or below about 1.1 ml/min.

3. The method of claim 2, wherein the second collective flow rate is above about 1.1 ml/min.

4. The method of claim 3, wherein the second collective flow rate is in a range from about 1.5 ml/min. to about 2.5 ml/min.

5. The method of claim 1, wherein the step of introducing precursors for the first time duration is at a first flow ratio of a lead precursor to the sum of a zirconium precursor and a titanium precursor;
   and wherein the step of introducing precursors for the second time duration is at a second flow ratio of the lead precursor to the sum of the zirconium and titanium precursors that is higher than the first flow ratio.

6. The method of claim 1, wherein the oxidizing gas introduced for the first time duration comprises oxygen at a first concentration;
   and wherein the oxidizing gas introduced for the first time duration comprises oxygen at a second concentration higher than the first concentration.

7. The method of claim 1, further comprising:
   prior to the step of introducing precursors for the first time duration, heating the chamber containing the body to a susceptor temperature below about 640 deg C.

8. The method of claim 7, further comprising:
   after the step of introducing precursors for the first time duration, increasing the temperature in the chamber to a susceptor temperature above 640 deg C.

9. A ferroelectric capacitor in an integrated circuit, formed by a process comprising the steps of:
   depositing a first conductive film near a semiconducting surface of a body;
   then depositing a first partial layer of ferroelectric material over the first conductive film by metalorganic chemical vapor deposition comprising the step of:
      for a first time duration, introducing precursors of lead, zirconium, and titanium, and a solvent, into a chamber containing the body at a first collective flow rate; and
   depositing a second partial layer of ferroelectric material over the first partial layer by metalorganic chemical vapor deposition comprising the step of:
      for a second time duration, introducing the precursors of lead, zirconium, and titanium, and a solvent, into the chamber at a second collective flow rate greater than the first collective flow rate;
   depositing a second conductive film overlying the ferroelectric material; and
   removing portions of the first and second conductive films, and the ferroelectric material, at selected locations, to define the ferroelectric capacitor.

10. The capacitor of claim 9, wherein the first collective flow rate is at or below about 1.1 ml/min.

11. The capacitor of claim 10, wherein the second collective flow rate is above about 1.1 ml/min.

12. The capacitor of claim 11, wherein the second collective flow rate is in a range from about 1.5 ml/min. to about 2.5 ml/min.

13. The capacitor of claim 9, wherein the step of depositing the first partial layer introduces precursors for the first time duration at a first flow ratio of a lead precursor to the sum of a zirconium precursor and a titanium precursor;

and wherein the step of depositing the second partial layer introduces precursors for the second time duration at a second flow ratio of the lead precursor to the sum of the zirconium and titanium precursors that is higher than the first flow ratio.

14. The capacitor of claim 9, wherein the process further comprises:

during the step of introducing precursors for the first time duration, introducing into the chamber an oxidizing gas comprising oxygen at a first concentration; and during the step of introducing precursors for the second time duration, introducing into the chamber an oxidizing gas comprising oxygen at a second concentration higher than the first concentration.

15. The capacitor of claim 9, wherein the step of depositing the first partial layer further comprises:

prior to introducing precursors for the first time duration, heating the chamber containing the body to a susceptor temperature below about 640 deg C.

16. The capacitor of claim 15, wherein the step of depositing the second partial layer further comprises:

increasing the temperature in the chamber to a susceptor temperature above 640 deg C.

\* \* \* \* \*